United States Patent [19]

Sasaki et al.

[11] Patent Number: 4,737,631

[45] Date of Patent: Apr. 12, 1988

[54] FILTER OF PHOTOELECTRIC TOUCH PANEL WITH INTEGRAL SPHERICAL PROTRUSION LENS

[75] Inventors: Hiroaki Sasaki; Kazuo Hasegawa; Junichi Ouchi, all of Furukawa, Japan

[73] Assignee: Alps Electric Co., Ltd., Japan

[21] Appl. No.: 864,709

[22] Filed: May 19, 1986

[30] Foreign Application Priority Data

May 17, 1985 [JP] Japan .................................. 60-105326

[51] Int. Cl.⁴ ............................................... G01V 9/04
[52] U.S. Cl. ...................................... 250/221; 250/216
[58] Field of Search .................... 250/221, 222.1, 237, 250/208, 209, 216; 340/555, 556, 557

[56] References Cited

U.S. PATENT DOCUMENTS

| 4,015,122 | 3/1977 | Rubinstein | 250/221 |
| 4,267,443 | 5/1981 | Carroll et al. | 250/221 |
| 4,467,193 | 8/1984 | Carroll | 250/216 |

Primary Examiner—David C. Nelms
Attorney, Agent, or Firm—Guy W. Shoup

[57] ABSTRACT

A filter of a photoelectric touch panel which is disposed on the front of an array mounted with light emitting elements and/or light receiving elements and disposed around a faceplate in the form of a frame, and characterized in that converging sections are formed on the filter at least at positions corresponding to the individual elements, thereby eliminating preparation of converging lenses.

2 Claims, 1 Drawing Sheet

FILTER OF PHOTOELECTRIC TOUCH PANEL WITH INTEGRAL SPHERICAL PROTRUSION LENS

BACKGROUND OF THE INVENTION

1. Field of the Invention

This invention relates to a filter of a photoelectric touch panel of the type wherein a light emitting element array and a light receiving element array are assembled into the form of a frame around a faceplate so as to generate infrared beams in the form of a matrix and its coordinate is input into a computer through detection of the position of of a finger or touch pen, which is interposed in front of the optical elements.

2. Description of the Prior Art

In the field of photoelectric touch panels, generally, an accurate matrix is formed by narrowing each infrared beam, and there has been known the technique of disposing a lens on the front of each optical element.

However, this technique of disposing lenses increased correspondingly the number of parts and the work of disposing the lenses in correspondence with the individual optical elements was troublesome. Photoelectric touch panels are also provided with a filter in the form of a frame in front of the optical elements around the faceplate of the display in order to prevent light external to the panel from affecting the light receiving elements and, conversely, to prevent light from the light emitting elements from being projected outside the panel.

SUMMARY OF THE INVENTION

It is an object of the present invention to solve the foregoing problem of the prior art, thus to provide, by making use of the circumstance that a filter is disposed on the front of optical elements, a filter of a photoelectric touch panel which narrows an infrared beam without need of preparing any independent lenses, thereby reducing the number of parts and simplifying a manufacturing process.

To achieve the foregoing object, the present invention is characterized in that converging sections are formed on a filter disposed on the front of an array mounted with light emitting elements and/or light receiving elements and disposed around a faceplate in the form of a frame, at least at positions corresponding to the individual elements.

DESCRIPTION OF THE PREFERRED EMBODIMENT

Figure 1:
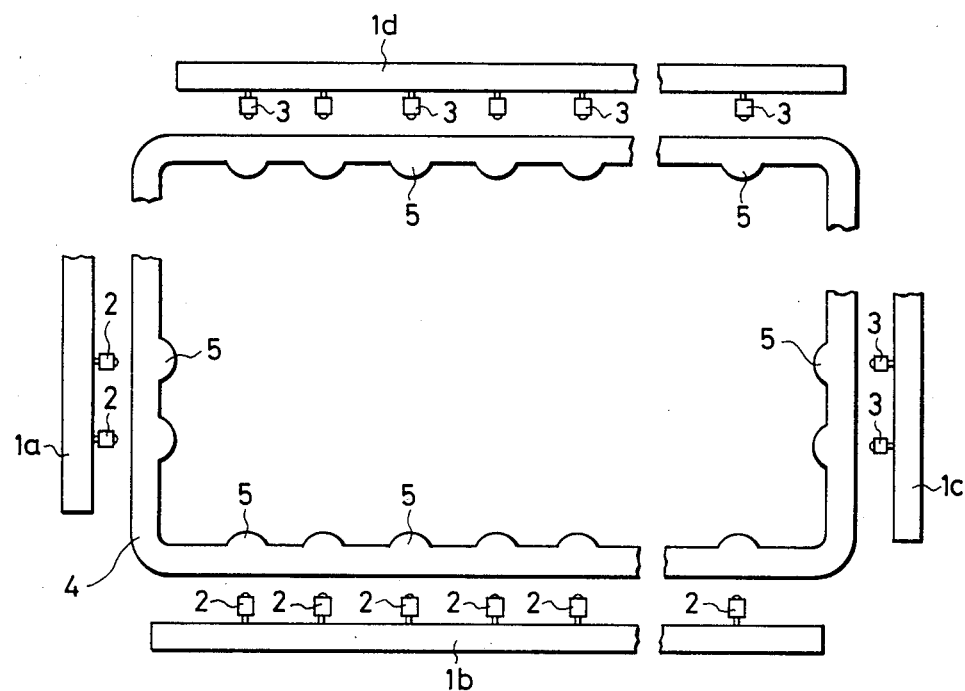
FIG. 1 is a schematic front view showing the state wherein a filter according to the present invention is incorporated.
Figure 2:
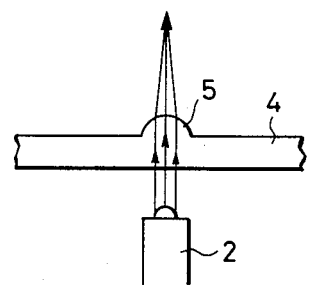
FIG. 2 is an enlarged view of an LED portion of the above.
Figure 3:
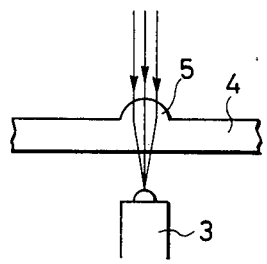
FIG. 3 is an enlarged view of a phototransistor portion.

An embodiment of the present invention will now be described with reference to the drawings.

In the drawings, reference numerals 1$a$, 1$b$, 1$c$, and 1$d$ indicate arrays disposed in the form of a frame around the faceplate of a display, on these arrays 1$a$ and 1$b$ LEDs 2, 2, . . . serving as light emitting elements are arranged at a certain spacing, and on the arrays 1$c$ and 1$d$ phototransistors 3, 3, . . . serving as light receiving elements are arranged in correspondence with the LEDs 2, 2, . . . , whereby infrared beams are generated in the form of a matrix.

Further, in the drawings, reference numeral 4 indicates a filter disposed on the front of the LEDs 2, 2, . . . and phototransistors 3, 3, . . . along the arrays 1$a$, 1$b$, . . . , and on this filter 4, converging sections 5, 5, . . . protruding with a spherical shape are formed at positions corresponding to the LEDs 2, 2, . . . and phototransistors 3, 3, . . . . Because the converging section 5 is of a spherical shape, it possesses the effect of a convex lens and functions so as to converge the rays emitted from the LEDs 2 and to be received by the phototransitors 3.

As described hereinabove, according to the present invention, the filter possesses the function of a lens additionally; thus, there is no need of preparing lenses independently, and the number of parts and manufacturing steps can be cut down.

What is claimed is:

1. In a photoelectric touch panel having arrays of light emitting elements and light receiving elements disposed around the sides of a display screen for forming a matrix of light beams in front of the display screen for detecting the presence of a pointing object interposed in the matrix, and a filter disposed in front of the light receiving and emitting elements around the sides of the display screen for preventing light external to the panel from affecting the light receiving elements and light from the light emitting elements from being projected outside the panel, the improvement comprising said filter being formed as a single rectangular frame body of which the sides have on their surfaces facing into the matrix a plurality of spherical protrusions integrally formed thereon at positions corresponding to respective ones of the light emitting and receiving elements, said spherical protrusions serving the function of focusing light beams emitted or received by the light elements forming the matrix in combination with the function of said filter preventing light from being received or projected externally of said panel.

2. A filter of a photoelectric touch panel according to claim 1, wherein said elements are LEDs and/or phototransistors.

* * * * *